(12) United States Patent
Clifton et al.

(10) Patent No.: US 7,183,893 B2
(45) Date of Patent: Feb. 27, 2007

(54) TMR SENSOR WITH OXIDIZED ALLOY BARRIER LAYER AND METHOD FOR FORMING THE SAME

(75) Inventors: Peter Hampden Clifton, Eglinton (GB); Eric Walter Singleton, Maple Plain, MN (US); David James Larson, Northfield, MN (US); Brian William Karr, Savage, MN (US); Kristin Joy Duxstad, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 10/771,959

(22) Filed: Feb. 4, 2004

(65) Prior Publication Data

US 2005/0168317 A1    Aug. 4, 2005

(51) Int. Cl.
*H01L 43/00* (2006.01)
(52) U.S. Cl. .................................. 338/32 R; 338/32 H
(58) Field of Classification Search .............. 338/32 R, 338/32 H, 32 S; 360/324.2, 324.11, 324.12; 365/173; 257/295; 117/89
See application file for complete search history.

(56) References Cited

U.S. PATENT DOCUMENTS

| | | | |
|---|---|---|---|
| 5,764,567 A * | 6/1998 | Parkin | 365/173 |
| 5,793,711 A | 8/1998 | Bojarczuk, Jr. et al. | |
| 6,024,884 A | 2/2000 | Bryant et al. | |
| 6,183,859 B1 * | 2/2001 | Chen et al. | 428/332 |
| 6,335,081 B1 | 1/2002 | Araki et al. | |
| 6,473,275 B1 * | 10/2002 | Gill | 360/314 |
| 6,480,365 B1 * | 11/2002 | Gill et al. | 360/324.11 |
| 6,542,321 B1 | 4/2003 | Molstad et al. | |
| 6,556,388 B1 | 4/2003 | Everitt et al. | |
| 6,636,391 B2 * | 10/2003 | Watanabe et al. | 360/321 |
| 6,683,815 B1 * | 1/2004 | Chen et al. | 365/173 |
| 6,728,132 B2 * | 4/2004 | Deak | 365/173 |
| 6,756,128 B2 * | 6/2004 | Carey et al. | 428/811.1 |
| 6,759,120 B2 * | 7/2004 | Jongill et al. | 360/314 |
| 6,777,731 B2 * | 8/2004 | Kreupl | 257/295 |
| 6,923,860 B1 * | 8/2005 | Karr et al. | 117/89 |
| 2002/0030945 A1 * | 3/2002 | Odagawa et al. | 360/313 |
| 2002/0034056 A1 | 3/2002 | Chen et al. | |
| 2002/0054462 A1 * | 5/2002 | Sun et al. | 360/324.2 |
| 2003/0035255 A1 * | 2/2003 | Hasegawa et al. | 360/324.11 |
| 2003/0127674 A1 * | 7/2003 | Ramesh | 257/295 |
| 2004/0211749 A1 * | 10/2004 | Grynkewich et al. | 216/2 |
| 2004/0262258 A1 * | 12/2004 | Hoehn et al. | 216/22 |
| 2005/0111147 A1 * | 5/2005 | Hiramoto et al. | 360/324.11 |

OTHER PUBLICATIONS

Michael P. Brady, et al., The Oxidation and Protection of Gamma Titanium Aluminides, JOM, Nov. 1996, pp. 46-50.
M.P. Brady, et al., Alloy Design Strategies for Promoting Protective Oxide-Scale Formation, JOM, Jan. 2000, pp. 16-21.
B.A. Jones, Theory of exchange coupling in magnetic multilayers, http:/www.research.ibm.com/journal/rd/421/jones.html, Aug. 22, 2003.

* cited by examiner

*Primary Examiner*—Tu Hoang
(74) *Attorney, Agent, or Firm*—Kinney & Lange, P.A.

(57) ABSTRACT

A tunneling magnetoresistive stack includes a first ferromagnetic layer, a tunnel barrier layer on the first ferromagnetic layer, and a second ferromagnetic layer on the tunnel barrier layer. The tunneling magnetoresistive stack exhibits a negative exchange coupling between the first ferromagnetic layer and the second ferromagnetic layer indicating that the tunneling magnetoresistive stack has a high quality tunnel barrier layer.

24 Claims, 7 Drawing Sheets

TMR SENSOR WITH OXIDIZED ALLOY BARRIER LAYER AND METHOD FOR FORMING THE SAME

BACKGROUND OF THE INVENTION

The present invention relates to a magnetoresistive sensor, and more particularly, to a tunneling magnetoresistive (TMR) sensor and method of making the same.

Many different types of magnetoresistive (MR) sensors exist today, including anisotropic magnetoresistive (AMR), giant magnetoresistive (GMR), and tunneling magentoresistive (TMR) sensors. TMR sensors have proved to be especially attractive for high density data storage applications for various reasons including their large signal output and reduced shield-to-shield spacing. TMR sensors typically include a multi-layered portion called a TMR stack. The TMR stack includes a tunnel barrier layer positioned between two ferromagnetic layers. The tunnel barrier is a very thin electrically insulating layer, such as an aluminum oxide ($Al_2O_3$), while the two ferromagnetic layers are typically formed of an electrically conductive ferromagnetic material. The ferromagnetic layer on one side of the tunnel barrier is called the pinned layer. The pinned layer has a fixed magnetization direction and provides a reference direction for the TMR sensor. The ferromagnetic layer on the other side of the tunnel barrier is referred to as the free layer. The free layer has a magnetization direction that can rotate in response to an external magnetic field from the magnetic medium.

A sense current is supplied through the ferromagnetic layers and the tunnel barrier and flows perpendicular to the plane of the layers. While the tunnel barrier is an electrically insulating layer, a phenomenon known as spin dependent tunneling allows electrons to pass through the tunnel barrier at a rate related to the magnetization direction of the external magnetic field. As the external magnetic field from the magnetic medium causes the magnetization direction of the freely rotating ferromagnetic layer to rotate, the resistance of the tunnel barrier changes. This resistance is related to the difference between the magnetization directions of the two ferromagnetic layers. By measuring the change in resistance (for example, by measuring the current flow) the TMR sensor can read the flux from magnetic bits stored on the magnetic medium.

One of the problems manufacturers have faced in the formation of TMR sensors is the occurrence of defects such as pinholes in the tunnel barrier layer. These defects create small electrical connections, or ohmic shunts, through the tunnel barrier that allow electrons to flow through the tunnel barrier without tunneling. This ohmic electron flow through the pinholes is not related to the external magnetic field from the magnetic medium. Because of this, the defects decrease the signal to noise ratio, reduce the sensitivity of the TMR sensor, and change the resistance of the tunnel barrier.

Another problem that manufacturers have faced is that of thermal instability. TMR sensors experience changes in temperature during normal operation due to current flow through the TMR sensor, as well as external heat sources that warm the surrounding material. Some materials do not have good thermal stability, which results in an unwanted temperature dependence of the properties of the TMR sensor. One of these properties is the resistance of the material. It is desirable that the resistance of the barrier layer remain constant. However, some materials with poor thermal stability experience an undesirable degradation in the resistance of the TMR sensor over time as the temperature of the material changes.

Finally, materials chosen for the TMR sensor must have the appropriate properties to function in a TMR sensor. For example, the tunnel barrier must have an appropriate resistivity. In addition, the ferromagnetic materials must have the proper magnetic response properties, and must be compatible with the tunnel barrier material. Many materials do not have all of the desired properties for a TMR sensor, and therefore cannot be used as a TMR barrier material.

Therefore, there is a need in the art for a TMR sensor which resolves these and other problems in the art.

BRIEF SUMMARY OF THE INVENTION

The present invention is a TMR stack having a first ferromagnetic layer, a second ferromagnetic layer, and a tunnel barrier formed between the first ferromagnetic layer and the second ferromagnetic layer. The tunnel barrier is formed of an oxidized titanium alloy which exhibits a good thermal stability and proper resistivity, and also provides a high quality barrier layer that improves the sensitivity of the TMR sensor. The TMR stack exhibits a negative exchange coupling between the first and second ferromagnetic layers which indicates that a high quality barrier has been formed.

DETAILED DESCRIPTION

Figure 1:
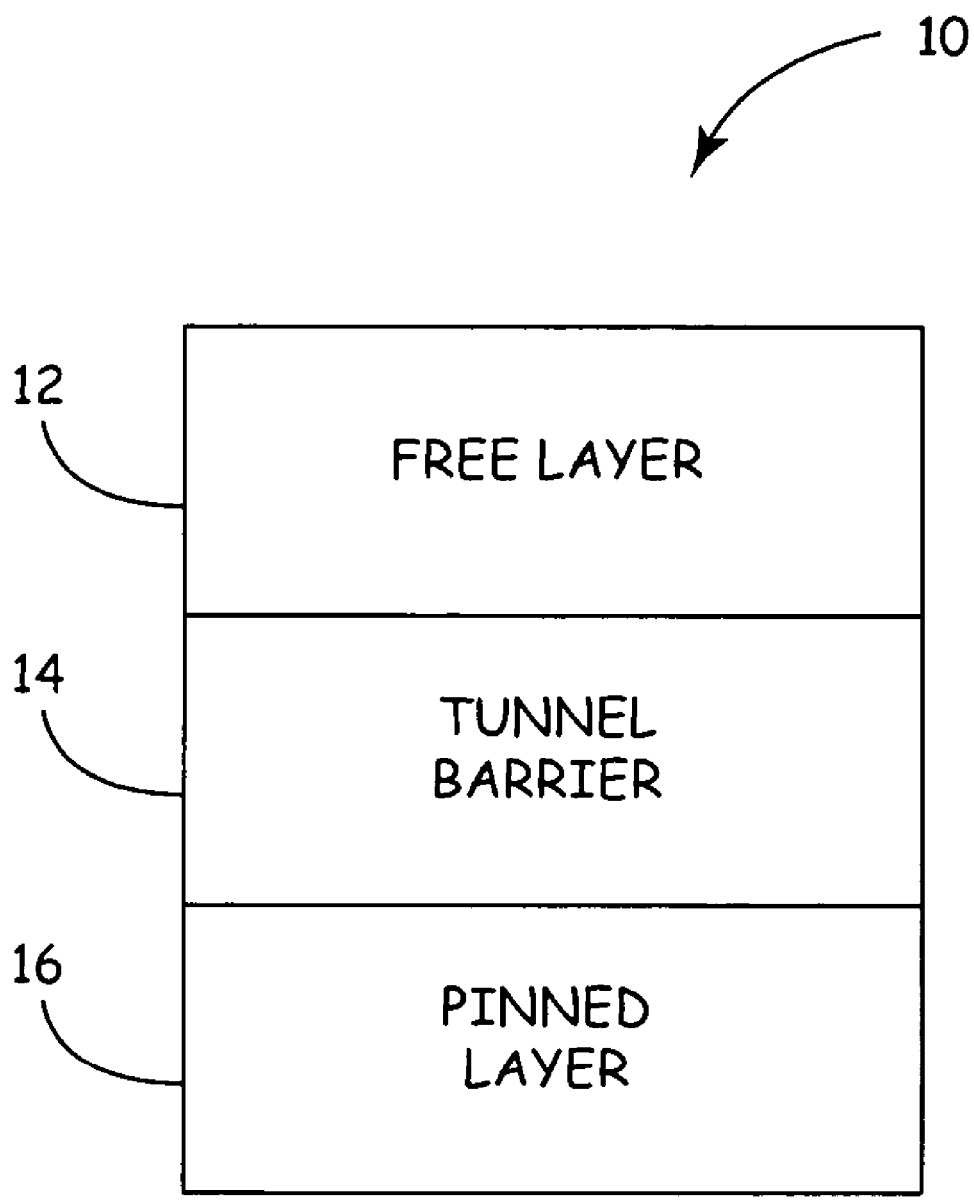
FIG. 1 is a layer diagram of a prior art TMR stack of a TMR sensor.

FIG. 1 is a layer diagram of a prior art TMR stack 10 of a TMR sensor. TMR stack 10 includes free layer 12, tunnel barrier layer 14, and pinned layer 16. Free layer 12 and pinned layer 16 are ferromagnetic layers formed on opposite sides of tunnel barrier layer 14. Free layer 12 has a magnetization direction that can rotate in response to an external magnetic field supplied by a magnetic medium. Pinned layer 16 has a fixed magnetization direction that provides a reference for the TMR sensor. Tunnel barrier layer 14 is an electrically insulating layer such as an oxide. Current flows through the TMR stack in a direction perpendicular to the planes of the layers, such that current flows through each layer of the stack. While tunnel barrier 14 is an electrically insulating material, a phenomenon known as electron tunneling allows electrons to travel through the barrier layer.

The rate at which electrons pass through the barrier and are spin scattered in free layer 12 is dependent upon the magnetic field direction from the external magnetic field of a magnetic medium. In this way, external circuitry can measure changes in current flow through the TMR stack to allow data to be read from the magnetic medium.

Though the magnetization direction of free layer 12 is able to rotate in the presence of an applied magnetic field, free layer 12 has a preferred magnetization direction caused by an exchange coupling between pinned layer 16 and free layer 12. Due to the exchange coupling, the magnetization direction of free layer 12 will point in the preferred magnetization direction when no external magnetic field is applied.

Figure 2:
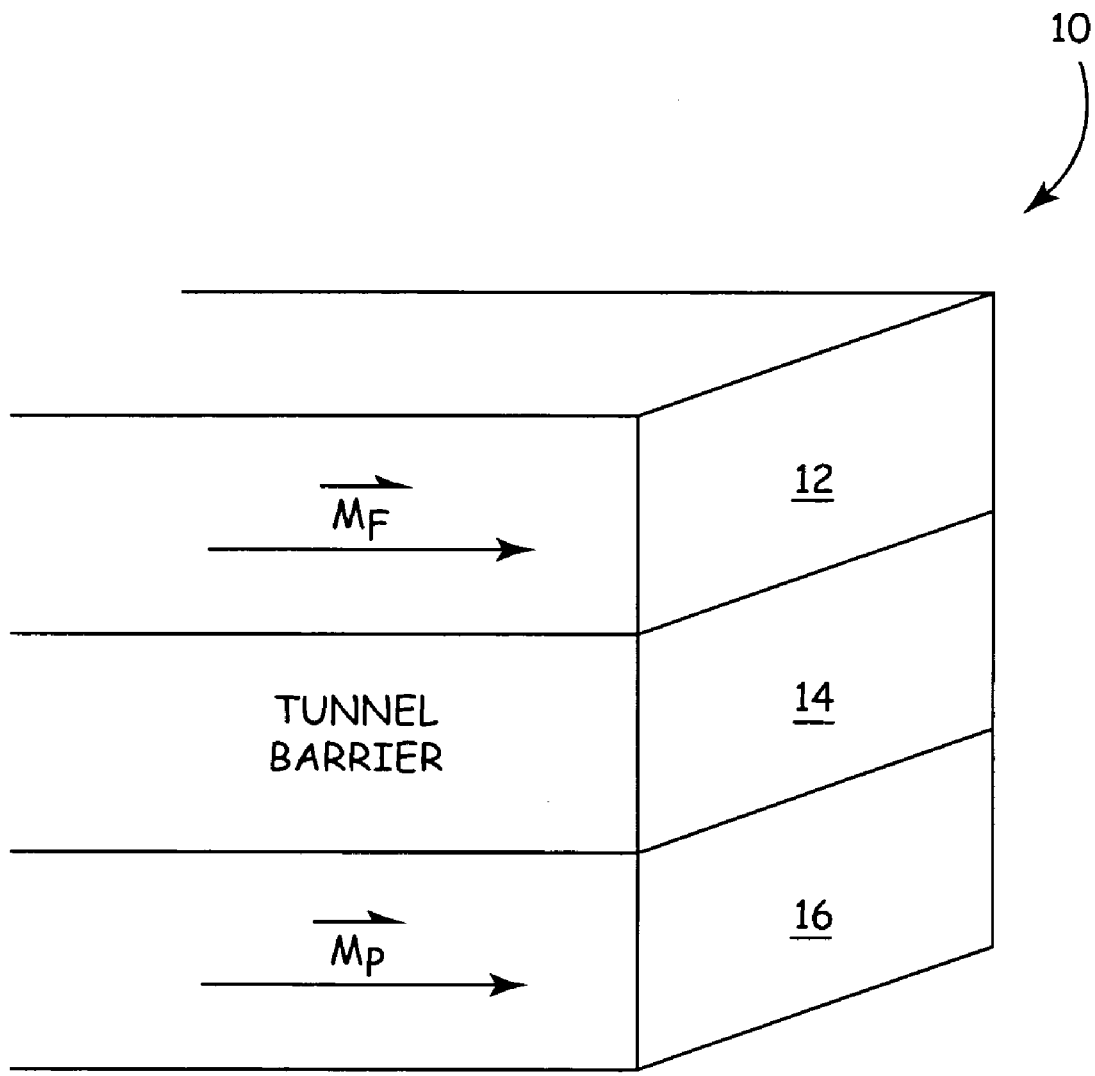
FIG. 2 is a perspective layer diagram of an exemplary prior art TMR stack.

FIG. 2 is a perspective layer diagram of prior art TMR stack 10. TMR stack 10 includes free layer 12, tunnel barrier layer 14, and pinned layer 16. The magnetization directions of free layer 12 and pinned layer 16 are shown as arrows $M_F$ and $M_P$, respectively, as they would be without any applied magnetic field. As shown, the magnetization direction of free layer 12 ($M_F$) points in the same direction as the magnetization direction of pinned layer 16 ($M_P$) when no external magnetic field is supplied. When an external magnetic field is applied to TMR sensor 10, the magnetization direction of free layer 12 ($M_F$) will not rotate until the applied magnetic field is strong enough to overcome the positive exchange coupling between free layer 12 and pinned layer 16. Once the exchange coupling has been overcome, the free layer will rotate with the applied magnetic field.

Figure 3:
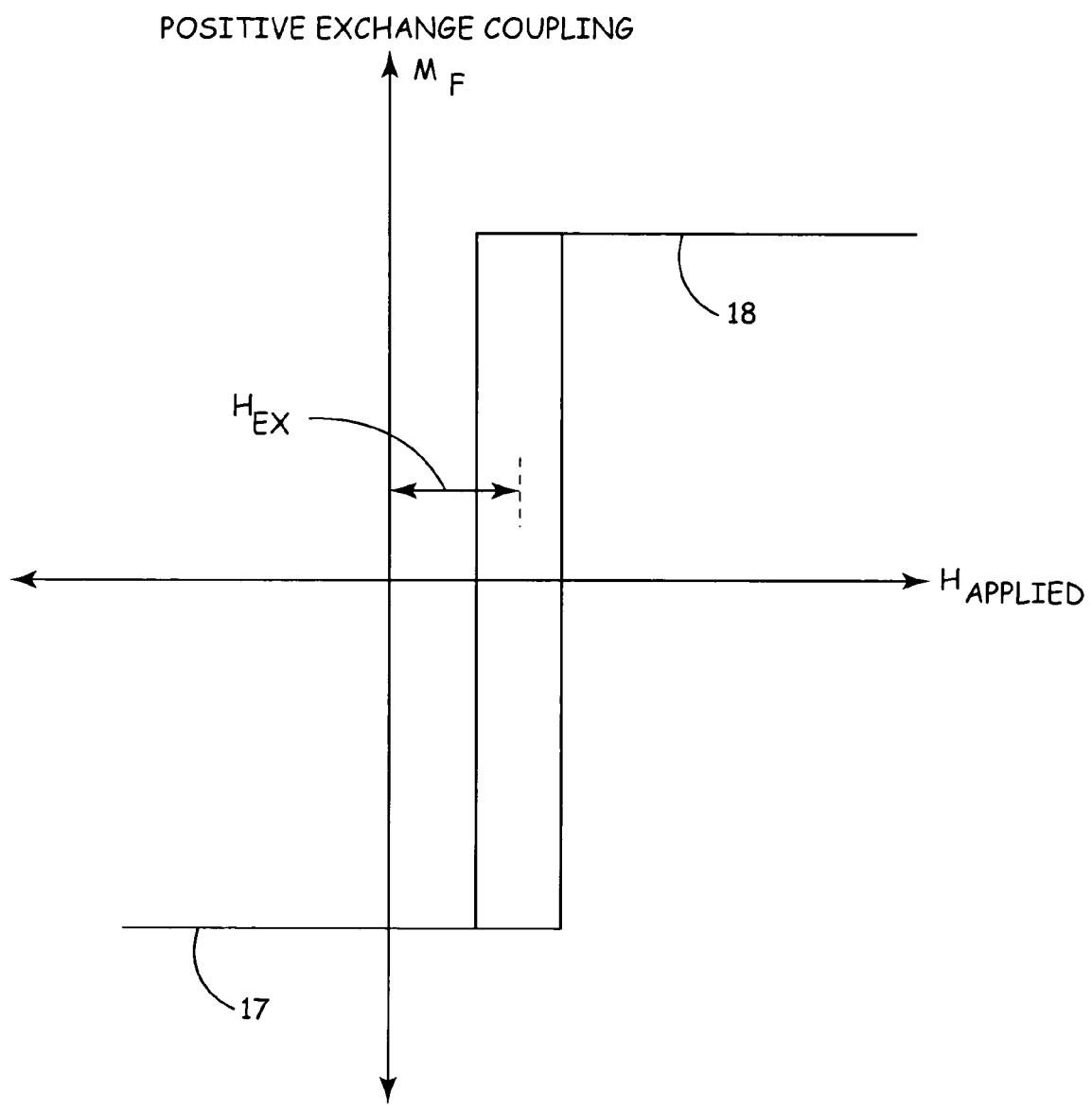
FIG. 3 is a graph showing the magnetization direction of the prior art free layer versus the applied magnetic field, which illustrates the positive exchange coupling of the prior art TMR stack.

FIG. 3 is a graph showing the magnetization direction of free layer 12 versus the applied magnetic field, which illustrates the positive exchange coupling of prior art TMR stack 10. As previously described, free layer 12 has a preferred magnetization direction that is caused by the exchange coupling between free layer 12 and pinned layer 16. This requires that an applied magnetic field reach a minimum strength before the free layer will rotate from the preferred direction. The axes of the graph show the applied magnetic field strength and direction on the x-axis and the magnetization direction of the free layer ($M_F$) on the y-axis. (Note that a negative applied magnetic field ($H_{APPLIED}<0$) indicates that the magnetic field is pointing in the opposite direction.) When the magnetization direction ($M_F$) is negative (as represented by state 17), the magnetization direction of free layer 12 points in the same direction as the magnetization direction of pinned layer 16. When the magnetization direction ($M_F$) is positive (as represented by state 18), the magnetization of free layer 12 points in the opposite direction as the magnetization of pinned layer 16.

FIG. 3 shows that as the applied magnetic field ($H_{APPLIED}$) is changed, the magnetization direction of the free layer switches between two states:

parallel to magnetization direction of pinned layer (state 17) or anti-parallel to magnetization direction of pinned layer (state 18). With no applied magnetic field ($H_{APPLIED}=0$), the magnetization direction of the free layer is parallel to the magnetization direction of the pinned layer. As the applied magnetic field is increased, the magnetization direction of the free layer continues to point parallel with the magnetization direction of the pinned layer (state 17), until the exchange coupling is overcome (approximately $H_{EX}$). At this point, the magnetization direction of the free layer rotates until it points in a direction antiparallel to the magnetization direction of the pinned layer (state 18). The magnetization direction of the free layer continues to point in this direction until the applied magnetic field is reduced to below $H_{EX}$. At this point, the magnetization direction of the free layer returns to the direction parallel to the magnetization direction of the pinned layer (state 17).

Figure 4:
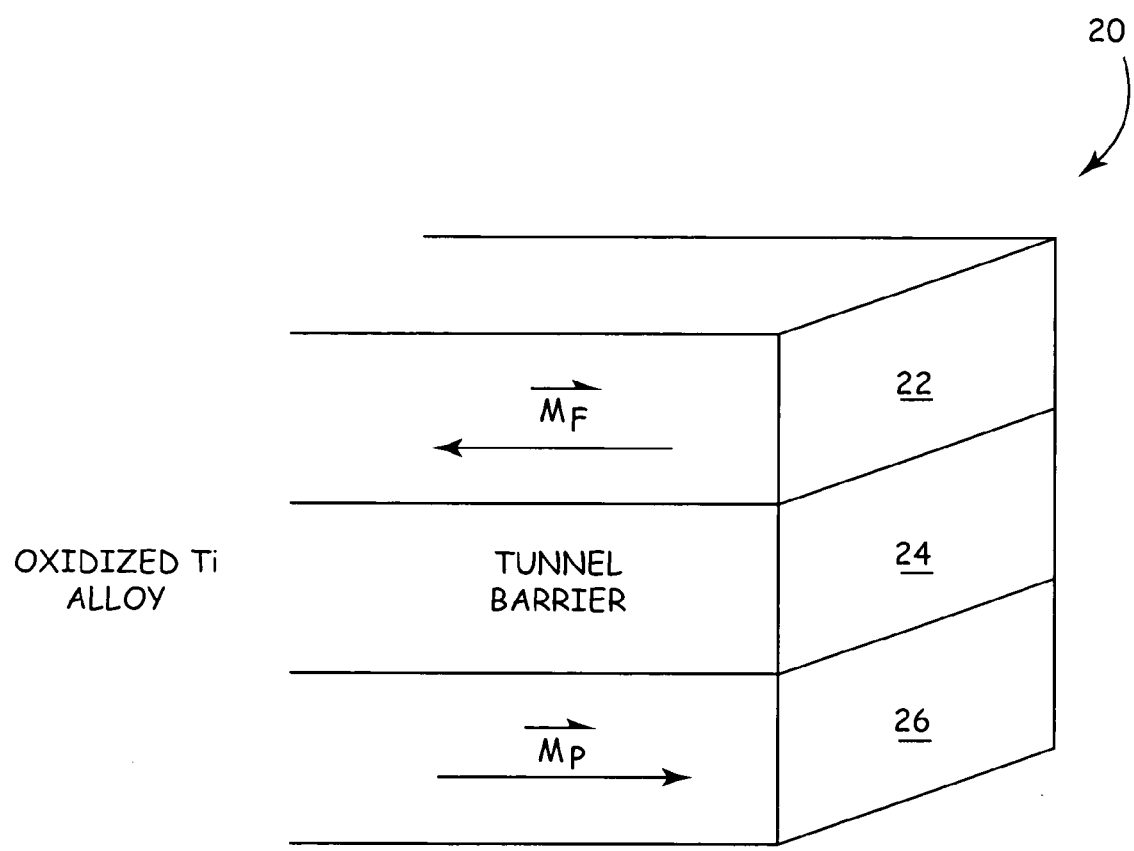
FIG. 4 is a perspective layer diagram of the TMR stack of the present invention.

FIG. 4 is a perspective layer diagram of TMR stack 20 of the present invention. TMR stack 20 includes free layer 22, tunnel barrier layer 24, and pinned layer 26. The magnetization directions of the layers are also shown with no external magnetic field applied. The magnetization direction of pinned layer 26 ($M_P$) points in a direction parallel with the layers, as shown. The magnetization direction of free layer 22 ($M_F$) points in a direction opposite the magnetization direction of pinned layer 26 ($M_P$).

To form an exemplary embodiment of TMR stack 20, pinned layer 26 is first formed. Pinned layer 26 is formed of a ferromagnetic material and is typically formed with a thickness in the range of 10 Å to 200 Å. The magnetization direction of pinned layer 26 is pinned in the direction indicated by $M_P$, and does not rotate in the presence of an external magnetic field. The magnetization direction of pinned layer 26 ($M_P$) provides a reference magnetization direction for TMR stack 20.

Tunnel barrier layer 24 is an electrically insulating material that is formed on pinned layer 26. In an exemplary embodiment, tunnel barrier 24 is formed by first depositing a titanium alloy. The titanium alloy may include metals such as aluminum, zirconium, hafnium or other metals. An exemplary barrier layer is described in more detail with reference to FIG. 6. The titanium alloy can be sputter deposited by co-deposition from two or more targets or by deposition from an alloy target. Other suitable methods of deposition also may be used including evaporation, chemical vapor deposition, atomic layer deposition, molecular beam epitaxy, molecular beam deposition, RF sputter deposition, and reactive deposition. These methods may also be used to form free layer 22 and pinned layer 26. In addition, the titanium alloy can be doped with other elements, such as Nb, Cr, Mo, P, Si, V, W, B, Co, or others. The dopant can be used to improve various properties of the tunnel barrier layer including making the tunnel barrier either more or less resistant to oxidation, and to improve metal layer growth on the barrier. During or subsequent to the deposition of the titanium alloy, tunnel barrier layer 24 is oxidized to form an electrically insulating layer. Completed tunnel barrier layer 24 will typically have a thickness less than 20 Å. In MRAM devices tunnel barrier layer 24 could be as thick as 30 Å or more.

Many different oxidation methods can be used to oxidize tunnel barrier layer 24 including but not limited to natural oxidation, radical shower oxidation, ultraviolet light assisted oxidation, ion beam oxidation, infrared assisted oxidation, x-ray assisted oxidation, or plasma oxidation. Oxidation is typically performed with an oxidation pressure in the range of 1 millitorr to 30 torr. For more information about oxidizing a tunnel barrier, see U.S. patent application Ser. No. 10/400,903, filed Mar. 27, 2003, entitled "Oxidation of Material For Tunnel Magneto-Resistive Sensors."

The oxidized titanium alloy that constitutes tunnel barrier layer 24 provides many benefits including an improved thermal stability, such that the properties of tunnel barrier layer 24, such as an electrical resistance, are not significantly changed with normal changes in temperature. In addition to thermal stability, tunnel barrier 24 can also be formed with the desired resistance×area product (RA) necessary for the proper operation of TMR stack 20.

After the formation of tunnel barrier 24, free layer 22 is formed over tunnel barrier layer 24. However, it is recognized that in an alternate embodiment the order of forming the layers could be reversed such that free layer 22 is formed below tunnel barrier layer 24. Free layer 22 is formed of a ferromagnetic material and typically has a thickness in the range of 10 Å to 200 Å. The magnetization direction of free layer 22($M_P$) is free to rotate in response to an external magnetic field. As with the prior art, free layer 22 also has a preferred magnetization direction due to the exchange coupling between pinned layer 26 and free layer 22. However, rather than having a positive exchange coupling, TMR stack 20 exhibits a negative exchange coupling between pinned layer 26 and free layer 22, as shown in FIG. 4. After TMR stack 20 has been formed, an anneal can be performed to establish the pinning of pinned layer 26 and also to improve the performance of the barrier layer. The anneal is typically performed at temperatures in the range of 100° C. to 350° C.

The fact that TMR stack 20 exhibits negative exchange coupling between pinned layer 26 and free layer 22, indicates that tunnel barrier layer 24 must be a high quality barrier having a great reduction in defects such as pinholes and roughness. When significant defects such as pinholes exist in a tunnel barrier layer, the TMR stack will not exhibit negative exchange coupling between the pinned layer and the free layer. Negative exchange coupling will now be described in more detail with reference to FIG. 5.

Figure 5:
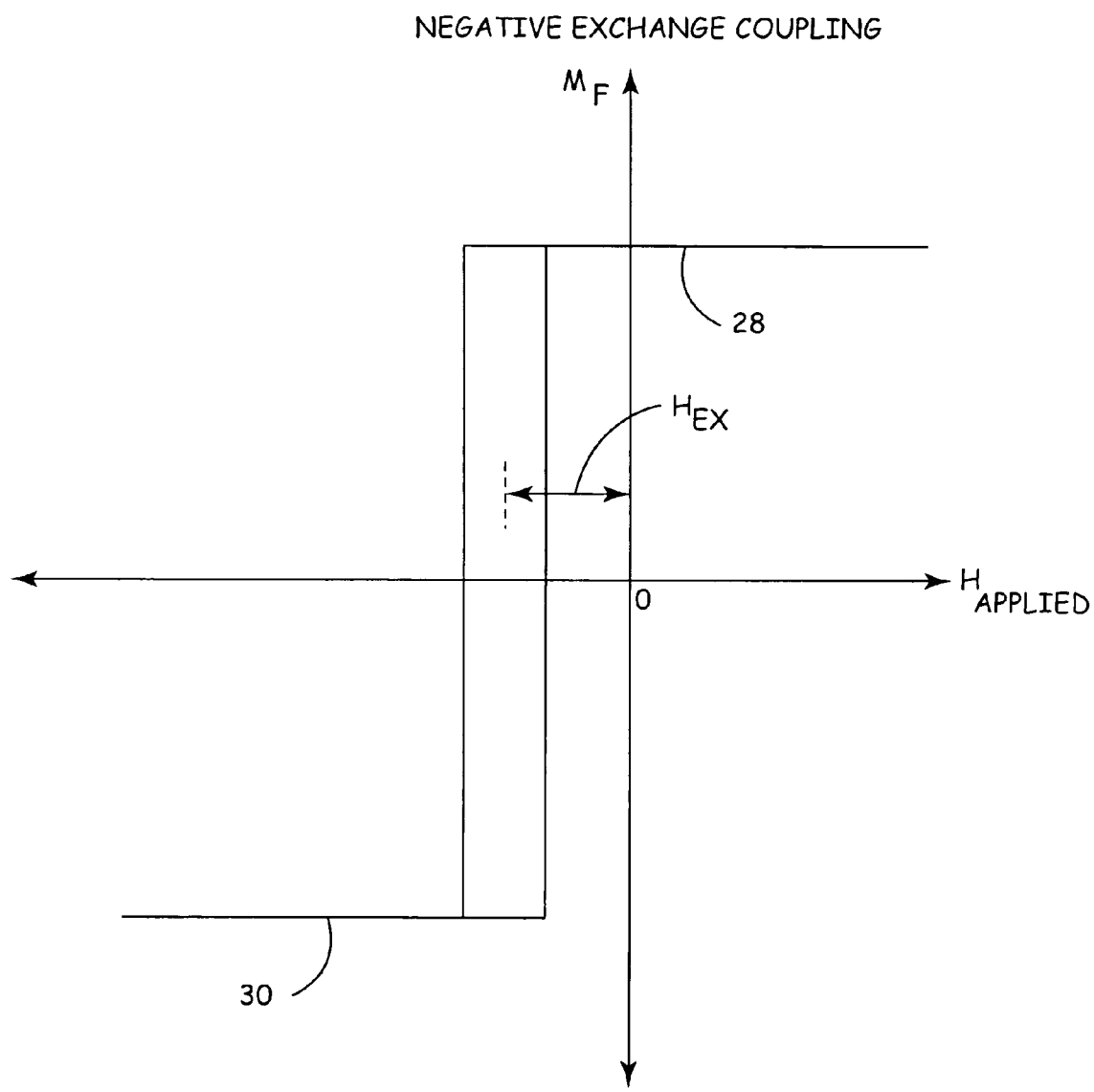
FIG. 5 is a graph illustrating the negative exchange coupling of the TMR stack of the present invention.

FIG. 5 is a graph illustrating the negative exchange coupling of TMR stack 20 of the present invention. The graph shows the applied magnetic field ($H_{APPLIED}$) on the x-axis and the magnetization direction of free layer 26 ($M_F$) on the y-axis. Starting with no applied magnetic field ($H_{APPLIED}=0$), the magnetization direction of the free layer points in a direction opposite the magnetization direction of pinned layer 26 (represented by numeral 28), as was shown in FIG. 4. As the applied magnetic field ($H_{APPLIED}$) is increased ($H_{APPLIED}>0$), the magnetization direction of free layer 22 ($M_F$) continues to point in the same direction.

With a negative magnetic field (a magnetic field in the opposite direction), the magnetization direction of the free layer continues to point in the direction opposite the direction of the pinned layer until the negative exchange coupling has been overcome ($H_{EX}$). At this point, the magnetization direction of the free layer ($M_F$) flips such that it points in a direction that is equal to the direction of pinned layer (represented by numeral 30). As the magnetic field is increased in the negative direction ($H_{APPLIED}<H_{EX}$), the magnetization direction of the free layer continues to point in this direction. When the external magnetic field is again reduced, the magnetization direction continues to point in this direction until the negative exchange coupling ($H_{EX}$) causes the magnetization direction of the free layer to return to the direction opposite the direction of the pinned layer (state 28).

Negative exchange coupling indicates that tunnel barrier 24 has a greatly reduced number of defects such as pinholes, or the size of the defects are greatly reduced, or both. Pinholes in prior art tunnel barrier 14 cause electrical connections to form between free layer 12 and pinned layer 16. These electrical connections allow electrical current to flow through tunnel barrier 14, without tunneling through. This electrical current is not dependent on the applied magnetic field, and therefore, greatly reduces the signal to noise ratio of prior art TMR stack 10. The reduction or elimination of defects (such as a reduction in pinholes or a reduction in defect size, or both) in tunnel barrier 24 of TMR stack 20 is evidenced by the fact that TMR stack 20 exhibits a negative exchange coupling. Therefore, TMR stack 20 will have an increased sensitivity since nearly all electrons will have to tunnel through tunnel barrier 24, causing an increase in the signal-to-noise ratio of the TMR head.

Figure 6:
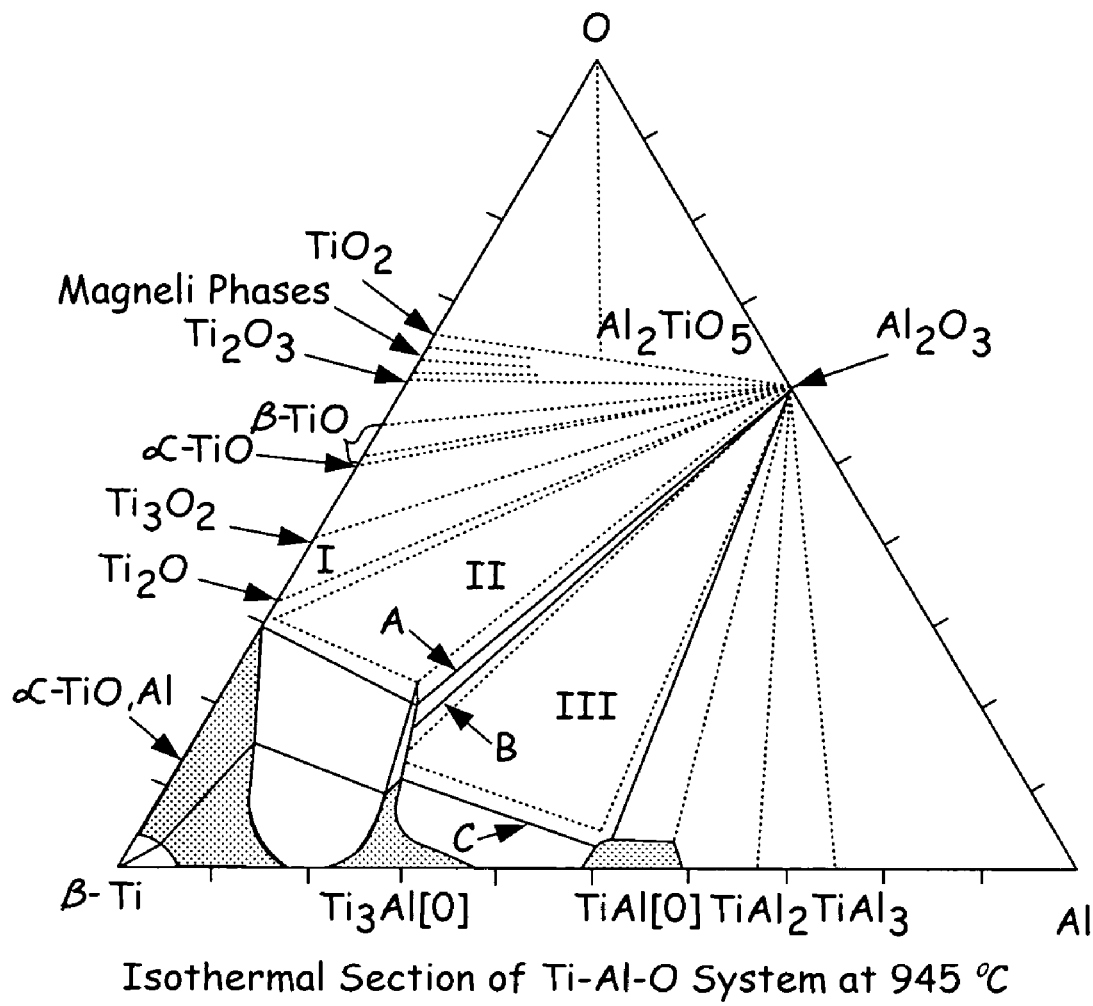
FIG. 6 is a ternary alloy phase diagram for a titanium-aluminum-oxygen alloy at 945° C.

FIG. 6 is a ternary alloy phase diagram for a titanium-aluminum-oxygen (Ti—Al—O) alloy at 945° C. taken from Seifert and Aldinger "Applied Phase Studies," Z. Metalkd. 87, 1996, 11. Ti—Al—O is a preferred material that can be used to form tunnel barrier 24. Examination of the Ti—Al—O system indicates that stable oxide phases may be formed of Ti—Al—O or co-formed from $Al_2O_3+TiO_x$. As shown in FIG. 6, the Ti—Al—O alloy can be formed in various possible phases. One possible phase is the $Al_2TiO_5$ phase. The formation of this phase is found to be strongly dependent on the oxygen partial pressure present during the reaction process, with increased oxygen content promoting the formation of this phase. This phase has a larger standard heat of formation than alumina (approximately 2607 kJ/Mol vs 1676 kJ/Mol) and therefore should give improved thermal stability over oxides such as alumina. Another beneficial phase is indicated in FIG. 6 by the line going from $TiO_2$ to $Al_2O_3$.

Figure 7:
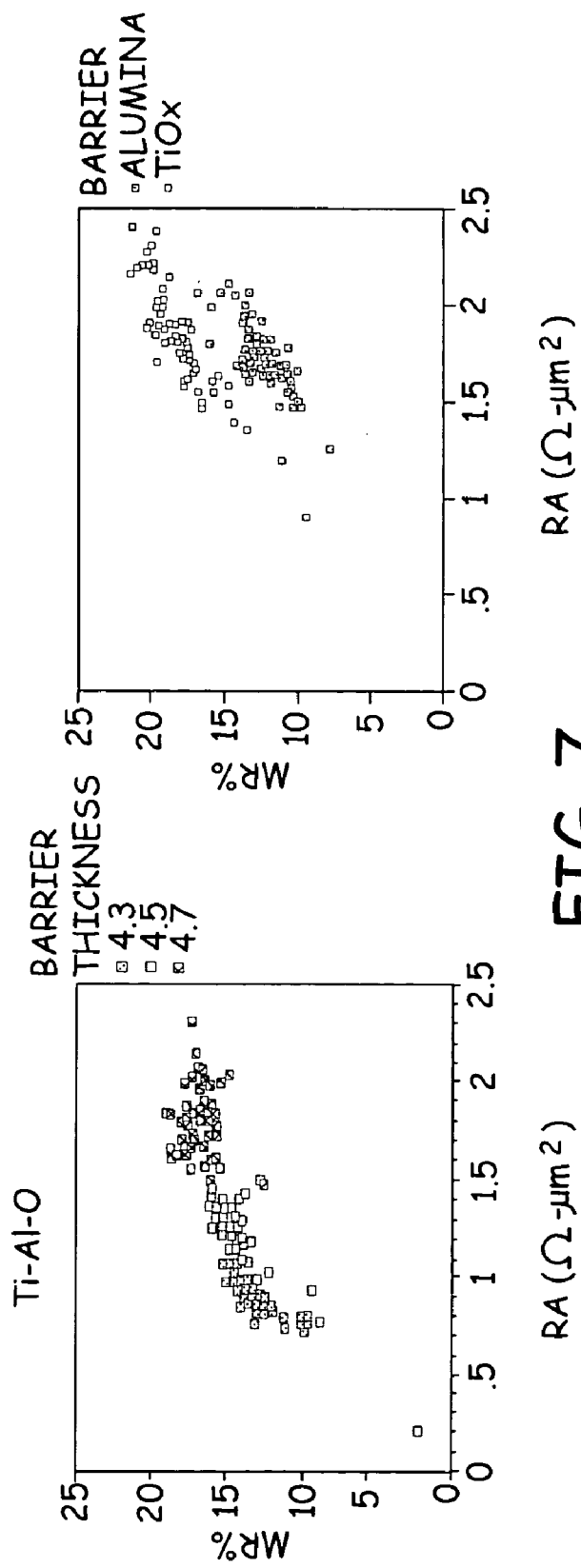
FIG. 7 is a comparison between the magnetoresistive ratio of an exemplary barrier layer of the present invention and the magnetoresistive ratio of other barrier layer materials.

FIG. 7 is a comparison between the magnetoresistive (MR) ratio of an exemplary Ti—Al—O barrier layer of the present invention and the MR ratio of other barrier layer materials. The plot on the left illustrates the MR ratio versus the resistivity (RA) for an exemplary Ti—Al—O tunnel barrier material formed with three different barrier layer thicknesses of 4.3 Å, 4.5 Å, and 4.7 Å. The plot on the right illustrates the MR ratio versus the resistivity for an alumina barrier layer and a $TiO_x$ barrier layer at a similar resistivity. The relatively small distribution of low resistivity and high MR with the Ti—Al—O samples is indicative of good barrier formation with a high degree of spin polarizing tunneling. A comparison of this with the alumina and $TiO_x$ barrier materials shows relatively large distributions of MR values for low resistivities.

Further evidence for the excellent low resistivity (RA) barrier performance of the Ti—Al—O system is shown in Table 1 where exchange coupling data for each of the three barrier materials are included for comparison. For the Ti—Al—O system, negative exchange coupling was observed and is a further indication of the formation of a high quality oxide barrier layer.

TABLE 1

| Barrier Material | Exchange Coupling (Oe) | |
| --- | --- | --- |
|  | RA = 0.7 | RA = 1.7 |
| $Al_2O_3$ | 79 | 48 |
| $TiO_x$ | 27 | 15 |
| Ti—Al—O | −2 | −13 |

Although the present invention has been described with reference to preferred embodiments, workers skilled in the art will recognize that changes may be made in form and detail without departing from the spirit and scope of the invention. For example, the present invention is described with reference to a pinned layer, tunnel barrier, and free layer configuration. It is recognized that the present invention would be equally beneficial in other configurations, such as an un-pinned trilayer configuration in which neither of the ferromagnetic layers on either side of the tunnel barrier layer are pinned. In addition to this, the present invention is described as having an oxidized tunnel barrier layer. It is recognized that other materials such as a nitride or oxynitride could also be used. Also, the present invention could be used in other applications such as MRAM.

The invention claimed is:

1. A tunneling magnetoresistive stack comprising:
   a first ferromagnetic layer;
   a tunnel barrier layer comprising a titanium alloy oxide on the first ferromagnetic layer; and
   a second ferromagnetic layer on the tunnel barrier layer, wherein the tunneling magnetoresistive stack exhibits a negative exchange coupling between the first ferromagnetic layer and the second ferromagnetic layer.

2. The tunneling magnetoresistive stack of claim 1, wherein the oxidized titanium alloy includes a dopant.

3. The tunneling magnetoresistive stack of claim 2, wherein the dopant is an element of the group consisting of Nb, Cr, Mo, P, Si, V, W, B, and Co.

4. The tunneling magnetoresistive stack of claim 1, wherein the oxidized titanium alloy includes an oxide of a metal of the group consisting of aluminum, zirconium, and hafnium.

5. The tunneling magnetoresistive stack of claim 1, wherein the tunnel barrier layer also comprises a dopant.

6. The tunneling magnetoresistive stack of claim 1, wherein the tunnel barrier layer comprises $Ti_xAl_yO_z$, wherein x, y, and z are greater than zero.

7. The tunneling magnetoresistive stack of claim 1, wherein the tunnel barrier layer comprises a combination of titanium, aluminum, and oxygen as represented in FIG. 6 as the line extending directly from $TiO_2$ to $Al_2O_3$.

8. The tunneling magnetoresistive stack of claim 1, wherein the first ferromagnetic layer is a pinned layer.

9. The tunneling magnetoresistive stack of claim 1, wherein the second ferromagnetic layer is a free layer.

10. A tunneling magnetoresistive stack comprising:
    a first ferromagnetic layer;
    a second ferromagnetic layer; and
    a tunnel barrier layer between the first and second ferromagnetic layers, wherein the tunnel barrier layer is an oxide of a titanium alloy, and wherein the tunneling magnetoresistive stack exhibits a negative exchange coupling between the first ferromagnetic layer and the second ferromagnetic layer.

11. The tunneling magnetoresistive stack of claim 10, wherein the oxide of a titanium alloy includes aluminum.

12. The tunneling magnetoresistive stack of claim 10, wherein the first ferromagnetic layer and the second ferromagnetic layer each have a thickness in the range of 10 Å to 200 Å.

13. The tunneling magnetoresistive stack of claim 10, wherein the tunnel barrier layer has a thickness less than 30 Å.

14. The tunneling magnetoresistive stack of claim 10, wherein the tunnel barrier includes a dopant.

15. The tunneling magnetoresistive stack of claim 14, wherein the dopant is an element of the group consisting of Nb, Cr, Mo, P, Si, V, W, B, and Co.

16. A tunneling magnetoresistive stack comprising:
    a first ferromagnetic layer having a first magnetization direction;
    a second ferromagnetic layer having a second magnetization direction opposite the first magnetization direction in the absence of an applied magnetic field;
    wherein the magnetoresistive stack exhibits a negative exchange coupling between the first ferromagnetic layer and the second ferromagnetic layer; and
    a tunnel barrier layer between the first and second ferromagnetic layers, wherein the tunnel barrier layer is an oxide, nitride or oxynitride of a titanium alloy.

17. The tunneling magnetoresistive stack of claim 16, wherein the tunnel barrier layer is a doped titanium alloy oxide.

18. The tunneling magnetoresistive stack of claim 17, wherein the titanium alloy oxide includes an oxide of a metal of the group consisting of aluminum, zirconium, and halfnium.

19. The tunneling magnetoresistive stack of claim 16, wherein the tunnel barrier layer comprises $Ti_xAl_yO_z$, wherein x, y, and z are greater than zero.

20. The tunneling magnetoresistive stack of claim 16, wherein the first ferromagnetic layer and the second ferromagnetic layer each have a thickness in the range of 10 Å to 200 Å.

21. The tunneling magnetoresistive stack of claim 16, wherein the tunnel barrier layer has a thickness less than 30 Å.

22. The tunneling magnetoresistive stack of claim 16, further comprising a dopant selected from the group consisting of Nb, Cr, Mo, P, Si, V, W, B, and Co.

23. The tunneling magnetoresistive stack of claim 16, wherein the first ferromagnetic layer is a pinned layer.

24. The tunneling magnetoresistive stack of claim 16, wherein the second ferromagnetic layer is a free layer.

* * * * *